US012672399B2

(12) United States Patent
Kim et al.

(10) Patent No.: US 12,672,399 B2
(45) Date of Patent: Jun. 30, 2026

(54) DISPLAY DEVICE HAVING LIGHT EMITTING DIODES WITH RECESSED PORTIONS BETWEEN SEMICONDUCTOR LAYERS

(71) Applicant: LG ELECTRONICS INC., Seoul (KR)

(72) Inventors: Jeomoh Kim, Seoul (KR); Wonyong Lee, Seoul (KR); Sukkoo Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 853 days.

(21) Appl. No.: 17/799,824

(22) PCT Filed: Feb. 13, 2020

(86) PCT No.: PCT/KR2020/002039
§ 371 (c)(1),
(2) Date: Aug. 15, 2022

(87) PCT Pub. No.: WO2021/162148
PCT Pub. Date: Aug. 19, 2021

(65) Prior Publication Data
US 2023/0069728 A1 Mar. 2, 2023

(51) Int. Cl.
*H10H 20/819* (2025.01)
*H10H 20/01* (2025.01)
(Continued)

(52) U.S. Cl.
CPC ...... *H10H 20/8312* (2025.01); *H10H 20/013* (2025.01); *H10H 20/017* (2025.01);
(Continued)

(58) Field of Classification Search
CPC .............. H10H 20/017; H10H 20/816; H10H 20/8162; H10H 20/819; H10H 20/821
See application file for complete search history.

(56) References Cited

U.S. PATENT DOCUMENTS 6,040,590 A * 3/2000 OBrien ................. H01S 5/0614
257/97
9,825,202 B2 11/2017 Schuele et al.
(Continued)

FOREIGN PATENT DOCUMENTS

CN 109301046 A 2/2019
EP 2 757 597 A2 7/2014
(Continued)

*Primary Examiner* — Younes Boulghassoul
(74) *Attorney, Agent, or Firm* — Birch, Stewart, Kolasch & Birch, LLP

(57) ABSTRACT

Discussed is a display device and a method for manufacturing the display device, and more particularly, to a display device using a semiconductor light emitting element having a size of several μm to several tens of μm, and a method for manufacturing the display device. The display device can include a board including a wiring electrode; and a plurality of semiconductor light emitting diodes electrically connected to the wiring electrode. Each of the plurality of semiconductor light emitting diodes an include a first conductivity type semiconductor layer, an active layer formed on the first conductivity type semiconductor layer, and a second conductivity type semiconductor layer formed on the active layer. The first conductivity type semiconductor layer can include a plurality of recessed portions.

14 Claims, 18 Drawing Sheets

(51) Int. Cl.
  H10H 20/816 (2025.01)
  H10H 20/824 (2025.01)
  H10H 20/831 (2025.01)
  H10H 20/857 (2025.01)
  H10W 90/00 (2026.01)

(52) U.S. Cl.
  CPC ........ H10H 20/816 (2025.01); H10H 20/819
    (2025.01); H10H 20/8242 (2025.01); **H10H
    20/857 (2025.01); H10W 90/00** (2026.01);
    *H10H 20/032* (2025.01); *H10H 20/0364*
    (2025.01)

(56) References Cited

U.S. PATENT DOCUMENTS

| | | | | | |
|---|---|---|---|---|---|
| 2011/0284894 | A1* | 11/2011 | Beom | .................. | H10H 20/819 |
| | | | | | 257/E33.006 |
| 2011/0286487 | A1* | 11/2011 | Sato | ...................... | H01S 5/0421 |
| | | | | | 372/45.011 |
| 2014/0204352 | A1* | 7/2014 | Mochizuki | ............. | B82Y 20/00 |
| | | | | | 257/94 |
| 2014/0294028 | A1* | 10/2014 | Shigihara | .............. | H01S 5/2031 |
| | | | | | 372/45.01 |
| 2018/0374991 | A1* | 12/2018 | Bour | .................. | H10H 20/8162 |
| 2021/0159269 | A1* | 5/2021 | Kim | ..................... | H10H 29/142 |
| 2023/0078258 | A1* | 3/2023 | Lee | ...................... | H10H 20/819 |
| | | | | | 257/79 |

FOREIGN PATENT DOCUMENTS

| | | | |
|---|---|---|---|
| KR | 10-2016-0003511 | A | 1/2016 |
| KR | 10-2018-0074726 | A | 7/2018 |
| KR | 10-2018-0091277 | A | 8/2018 |
| KR | 10-2019-0106885 | A | 9/2019 |
| KR | 10-2020-0006650 | A | 1/2020 |
| KR | 10-2020-0014868 | A | 2/2020 |
| WO | WO 2017/112490 | A1 | 6/2017 |
| WO | WO 2018/005286 | A1 | 1/2018 |

* cited by examiner

DISPLAY DEVICE HAVING LIGHT EMITTING DIODES WITH RECESSED PORTIONS BETWEEN SEMICONDUCTOR LAYERS

CROSS REFERENCE TO RELATED APPLICATIONS

This application is the National Stage filing under 35 U.S.C. 371 of International Application No. PCT/KR2020/002039, filed on Feb. 13, 2020, the contents of which are hereby incorporated by reference into the present application.

TECHNICAL FIELD

The present disclosure relates to a display device and a method of manufacturing the same, and in particular, to a display device using a semiconductor light emitting diode having a size of several to several tens of μm, and a method of manufacturing the same.

BACKGROUND ART

Recently, liquid crystal displays (LCD), organic light-emitting diode (OLED) displays, and micro LED displays are competing to implement a large-area display in the field of display technology.

Meanwhile, if a semiconductor light emitting diode (micro LED) having a cross-sectional area or diameter of 100 μm or less is used in the display, the display does not absorb light using a polarizing plate or the like, and thus, very high efficiency can be provided. However, since a large display requires millions of semiconductor light emitting diodes, it is difficult to transfer the elements, compared to other technologies.

Examples of a technology that is currently being developed as a transfer process include pick & place, laser lift-off (LLO), or self-assembly. Among them, the self-assembly is a method in which a semiconductor light emitting diode finds its own position in a fluid, and is the most advantageous method for realizing a large-screen display device.

Recently, although a micro LED structure suitable for self-assembly has been proposed in U.S. Pat. No. 9,825,202, research on a technology for manufacturing a display through self-assembly of the micro LED is still insufficient. Accordingly, the present disclosure proposes a new type of manufacturing method in which the micro LED can be self-assembled.

DISCLOSURE

Technical Problem

One object of the present disclosure is to provide a new manufacturing process having high reliability in a large-screen display using a micro-sized semiconductor light emitting diode.

Another object of the present disclosure is to provide a manufacturing process capable of improving transfer precision when self-assembling a semiconductor light emitting diode as an assembly board.

Another object of the present disclosure is to increase the light efficiency of a semiconductor light emitting diode used for self-assembly.

Technical Solution

In order to achieve the above object, the present disclosure provides a display device comprising a board including a wiring electrode; and a plurality of semiconductor light emitting diodes electrically connected to the wiring electrode; wherein each of the semiconductor light emitting diodes includes a first conductivity type semiconductor layer; an active layer formed on the first conductivity type semiconductor layer; and a second conductivity type semiconductor layer formed on the active layer, wherein the first conductivity type semiconductor layer includes a plurality of recessed portions.

In an embodiment, the first conductivity type semiconductor layer may include a plurality of first semiconductor layers and a plurality of second semiconductor layers that are alternately stacked.

In an embodiment, the plurality of recessed portions may be formed between the first semiconductor layers.

In an embodiment, a number of the recessed portion formed in the semiconductor light emitting diode may be a same as a number of the second semiconductor layers.

In an embodiment, an inner wall of the recessed portion may be formed of one surface of the first semiconductor layer and a side surface of the second semiconductor layer.

In an embodiment, an etching rate for a predetermined solution of a material constituting the second semiconductor layer may be faster than an etching rate for the predetermined solution of a material constituting the active layer, and the first semiconductor layer, and the second conductivity type semiconductor layer.

In an embodiment, the second semiconductor layer may be formed of AlInP doped with a dopant, and the active layer, the first semiconductor layer, and the second conductivity type semiconductor layer may be formed of AlGaInP doped with a dopant.

In an embodiment, each of the semiconductor light emitting diodes may include a first barrier layer disposed between the first conductivity type semiconductor layer and the active layer; and a second barrier layer disposed the active layer and the second conductivity type semiconductor layer.

In an embodiment, each of the semiconductor light emitting diodes may include a first recessed portion formed between the first conductivity type semiconductor layer and the active layer, and a second recessed portion formed between the active layer and the second conductivity type semiconductor layer.

In addition, the present disclosure provides a method of manufacturing a display device including: sequentially stacking a first conductivity type semiconductor layer, an active layer, and a second conductivity type semiconductor layer on a growth substrate; etching a portion of the layers stacked on the first conductivity type semiconductor layer so that a portion of the first conductivity type semiconductor layer is exposed to an outside; etching a portion of the first conductivity type semiconductor layer to form an individual semiconductor light emitting diode; and forming a recessed portion by etching a portion of the first conductivity type semiconductor layer, wherein the first conductivity type semiconductor layer includes a plurality of first semiconductor layers and a plurality of second semiconductor layers that are alternately stacked, wherein the forming a recessed portion by etching a portion of the first conductivity type semiconductor layer is performed by etching the second semiconductor layer faster than the first semiconductor layer.

Advantageous Effect

According to the present disclosure having the above configuration, in a display device in which individual pixels are formed of micro light emitting diodes, a large number of semiconductor light emitting diodes can be assembled at once.

As described above, according to the present disclosure, it is possible to convert a semiconductor light emitting diode into a large amount of pixel on a small-sized wafer and then transfer it to a large-area board. Through this, it is possible to manufacture a large-area display device at a low cost.

In addition, according to the manufacturing method of the present disclosure, a semiconductor light emitting diode is transferred simultaneously and multiple times in place using a magnetic field and an electric field in a solution, thereby being capable of realizing low-cost, high-efficiency, and high-speed transfer regardless of the size, number, or transfer area of parts.

Furthermore, since it is assembled by an electric field, selective assembly is possible through selective electrical application without a separate additional device or process. In addition, by disposing the assembly board on the upper side of the chamber, loading and unloading of the board can be facilitated, loading and unloading can be facilitated, and non-specific binding of the semiconductor light emitting diode can be prevented.

Further, according to the present disclosure, the resistance around the active layer becomes very large in the lateral direction. Accordingly, carriers flowing in the lateral direction of the semiconductor light emitting diode are reduced, and the carriers are concentrated in the direction in which the active layer is located. As a result, surface recombination is reduced. Through this, the present disclosure improves the light efficiency of the semiconductor light emitting diode.

In addition, according to the present disclosure, the recessed portion induces diffuse reflection from the side surface of the semiconductor light emitting diode to emit light from the active layer and reflects the light directed toward the side of the semiconductor light emitting diode toward the upper side surface of the semiconductor light emitting diode. Accordingly, while the amount of light emitted to the side surface of the semiconductor light emitting diode may decrease, the light efficiency of the semiconductor light emitting diode may increase.

DESCRIPTION OF DRAWINGS

FIG. 1 is a conceptual diagram illustrating an embodiment of a display device using a semiconductor light emitting diode of the present disclosure.

FIGS. 8A to 8E are conceptual views illustrating a process of self-assembling a semiconductor light emitting diode using the self-assembly apparatus of FIG. 6.

BEST MODE

Figure 2:
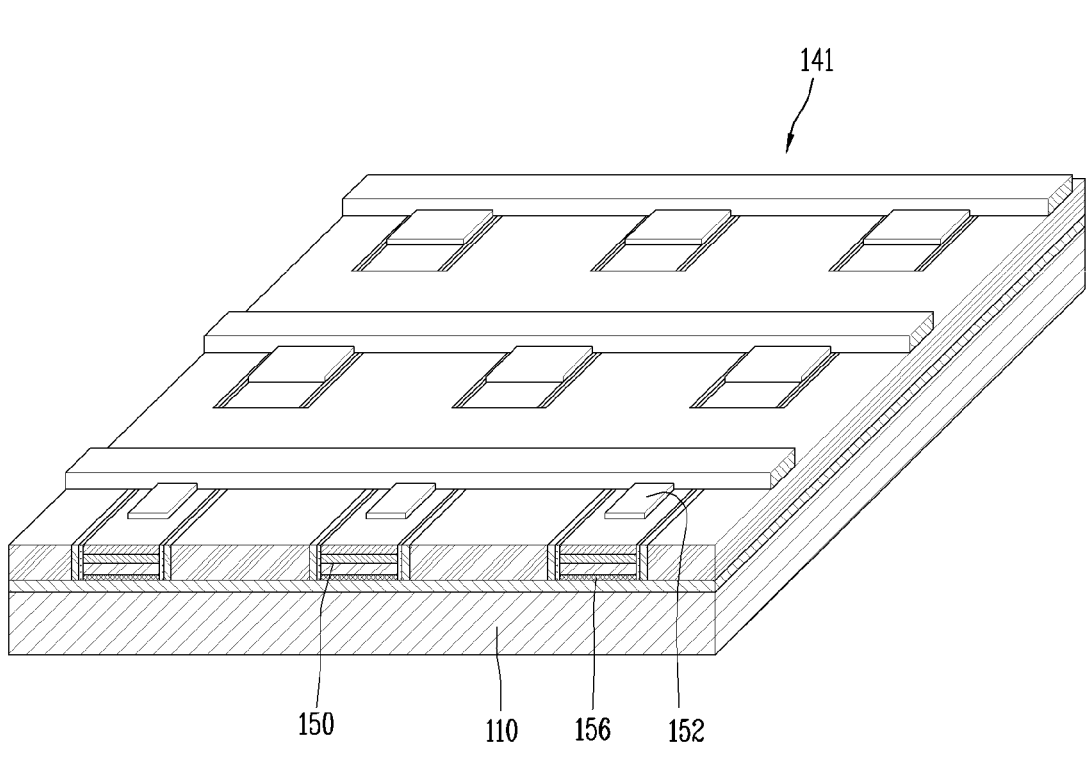
FIG. 2 is a partially enlarged view of portion A of the display device of FIG. 1.

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings.

It is also understood that when an element, such as a layer, region, or substrate, it is referred to as being "on" another element, it may be directly present on the other element or intervening elements in between.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

Figure 1:
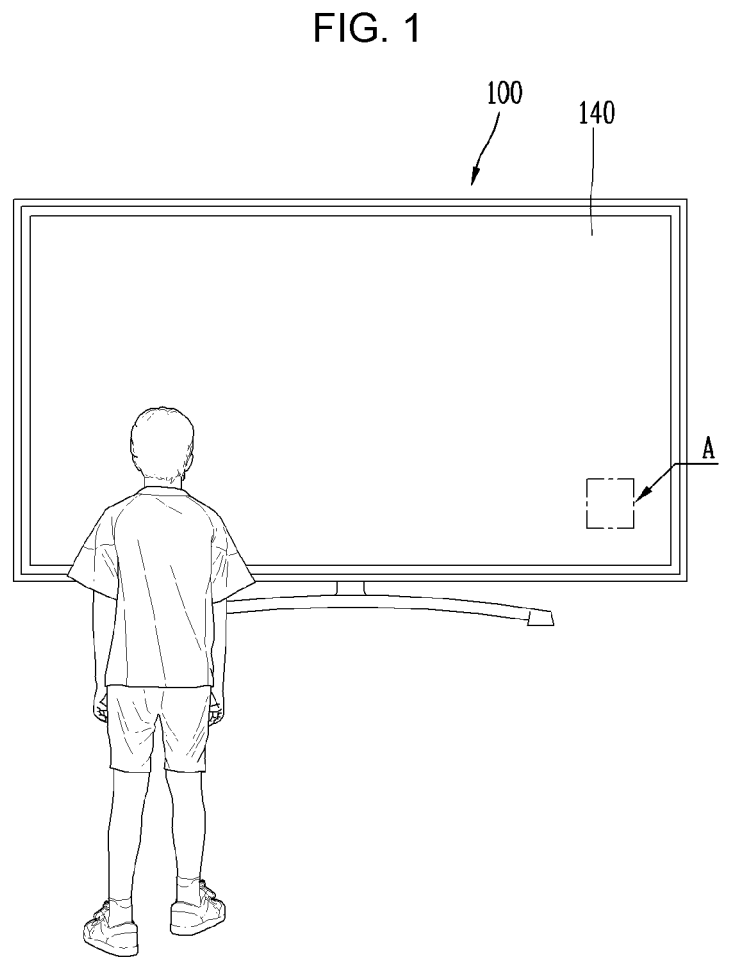
Figure 3:
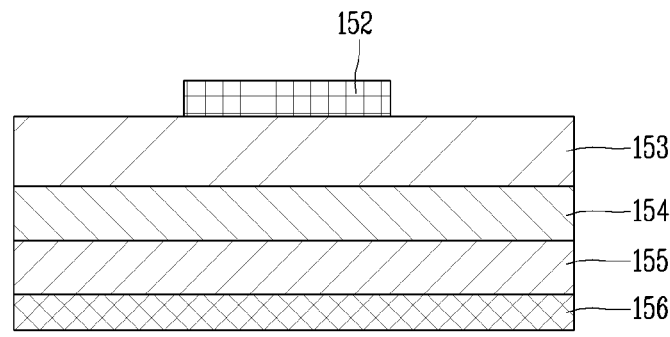
FIG. 3 is an enlarged view of the semiconductor light emitting diode of FIG. 2.
Figure 4:
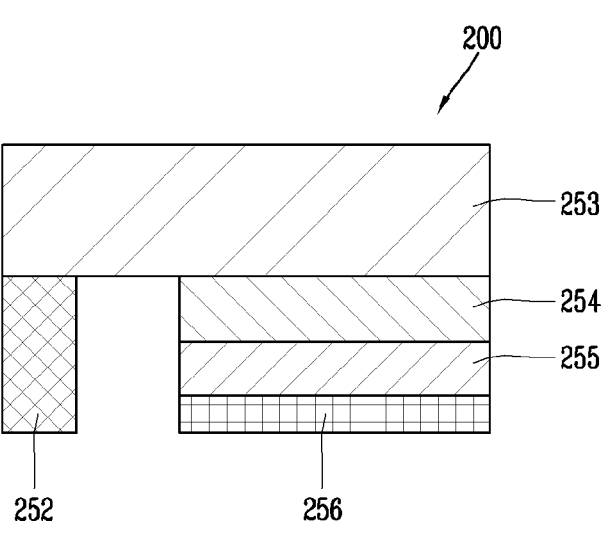
FIG. 4 is an enlarged view illustrating another embodiment of the semiconductor light emitting diode of FIG. 2.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a controller of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5A to 5E are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

Figure 5A:
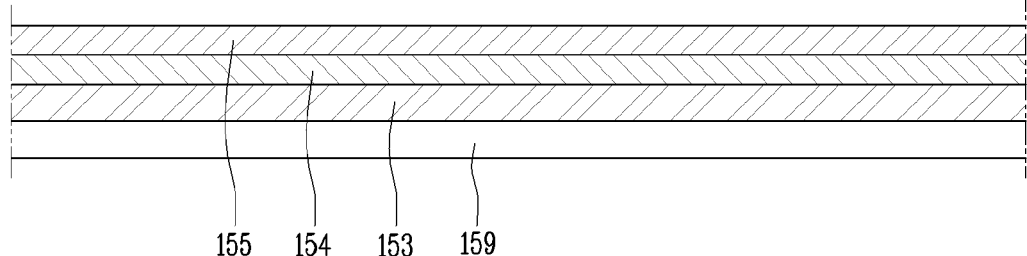
FIGS. 5A to 5E are conceptual views for describing a new process of manufacturing the semiconductor light emitting diode.

First, according to the manufacturing method, a first conductivity type semiconductor layer 153, an active layer 154, and a second conductivity type semiconductor layer 155 are individually grown on a growth substrate 159 (FIG. 5A).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5*a*, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive substrate or an insulating substrate, for example, a SiC substrate having higher thermal conductivity than a sapphire (Al2O3) substrate, or use at least one of Si, GaAs, GaP, InP, and Ga2O3.

Figure 5B:
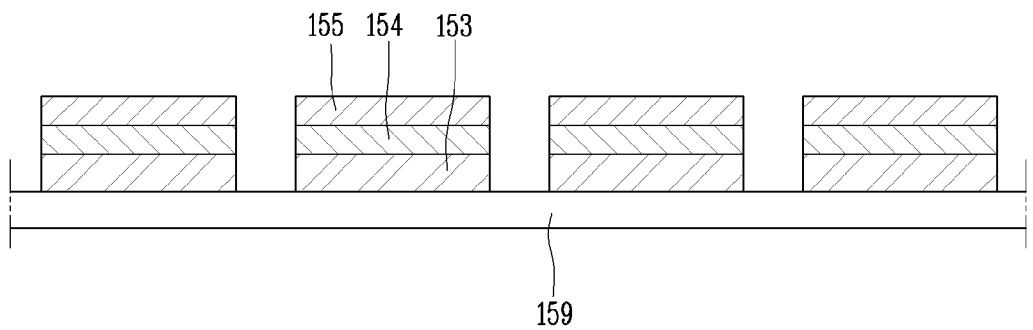

Next, at least a portion of the first conductivity type semiconductor layer 153, the active layer 154, and the second conductivity type semiconductor layer 155 are removed to form a plurality of semiconductor light emitting diodes (FIG. 5B).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Figure 5C:
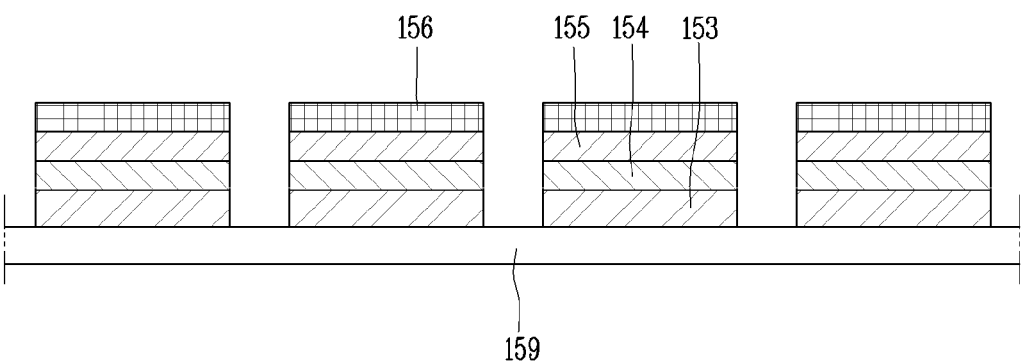

Next, second conductivity type electrodes 156 (or p-type electrodes) are formed on one surface of the second conductivity type semiconductor layer 155 (FIG. 5C). The second conductivity type electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Figure 5D:
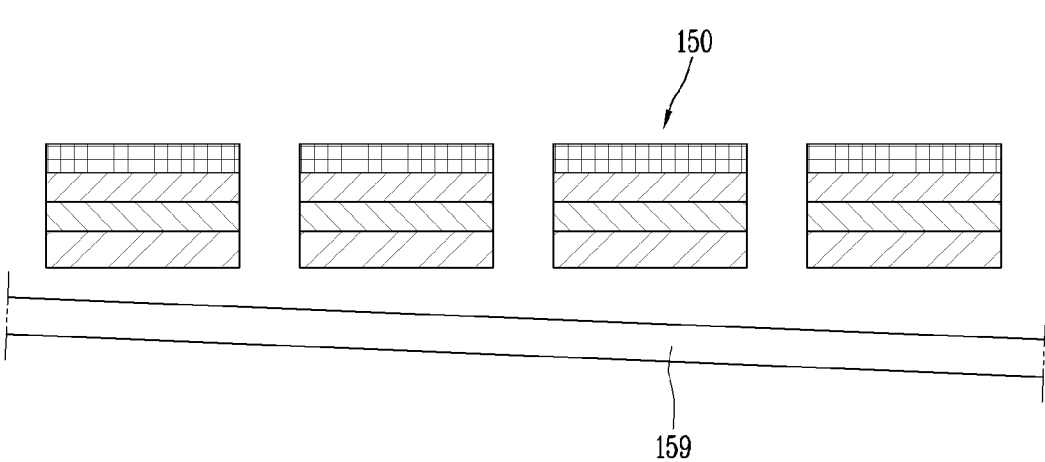

Then, the growth substrate 159 is removed to provide a plurality of semiconductor light emitting diodes. For example, the growth substrate 159 may be removed using a laser lift-off (LLO) method or a chemical lift-off (CLO) method (FIG. 5D).

Figure 5E:
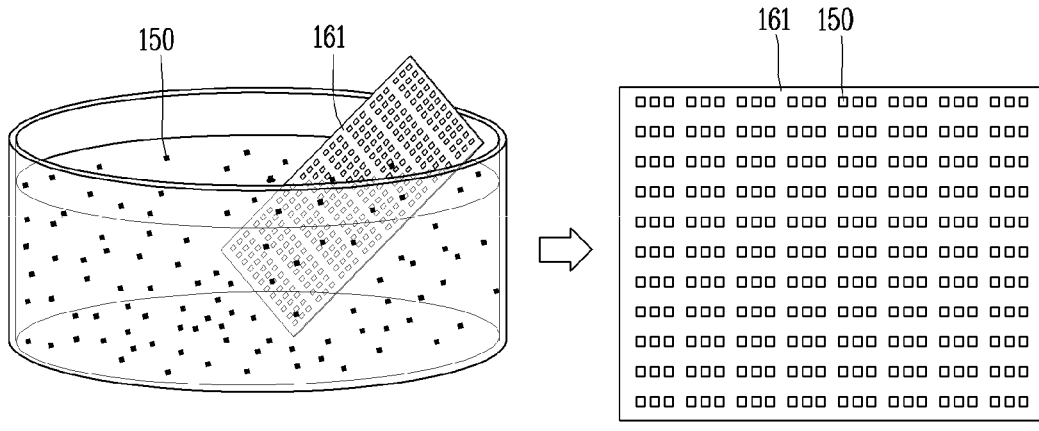

Thereafter, the semiconductor light emitting diodes 150 are seated on a board in a chamber filled with a fluid (FIG. 5E).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembled board 161.

As another example, it is also possible to put the wiring board in a fluid chamber instead of the assembly board 161 so that the semiconductor light emitting diodes 150 are directly seated on the wiring board. In this case, the board may be a wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

Figure 6:
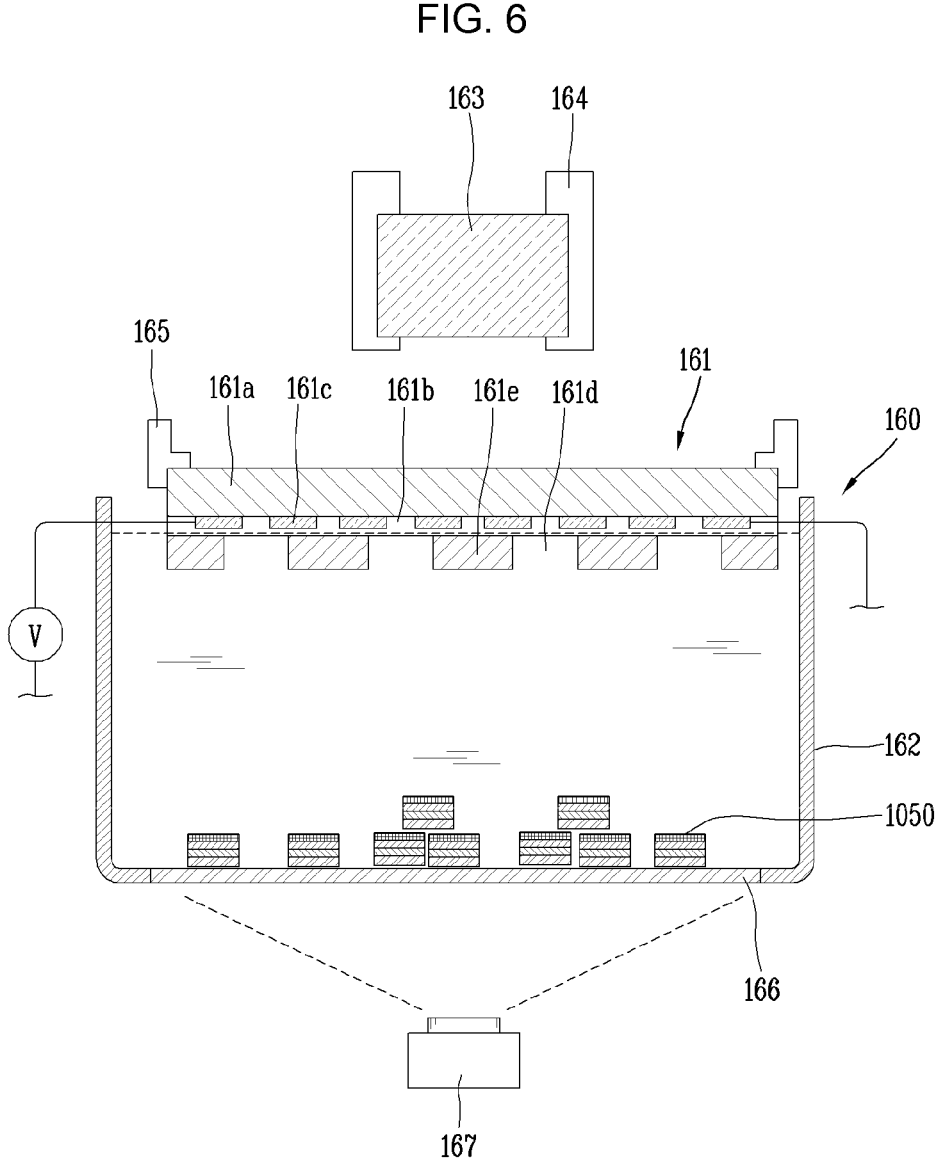
FIG. 6 is a conceptual diagram illustrating an example of a self-assembly apparatus of a semiconductor light emitting diode according to the present disclosure.
Figure 7:
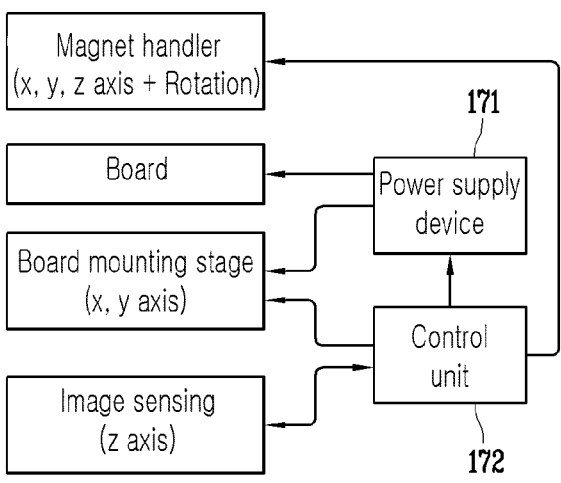
FIG. 7 is a block diagram of the self-assembly apparatus of FIG. 6.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8A to 8E are conceptual views illustrating a process of self-assembling a semiconductor light emitting diode using the self-assembly apparatus of FIG. 6, and FIG. 9 is a conceptual diagram for describing the semiconductor light emitting diode of FIGS. 8A to 8E.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5A to 5C. In this case, in the process of forming the second conductivity type electrode of FIG. 5C, a magnetic material may be deposited on the semiconductor light emitting diode.

Figure 8A:
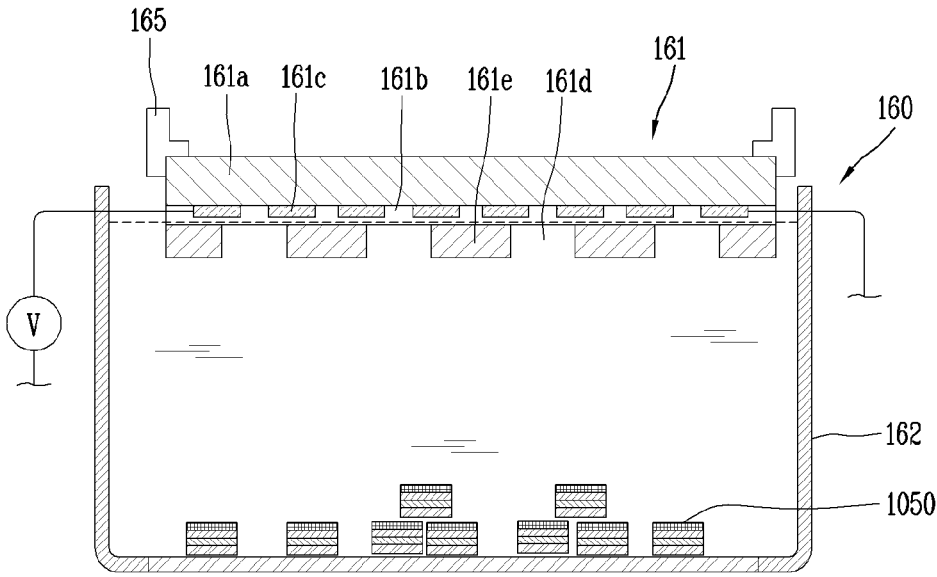
Figure 9:
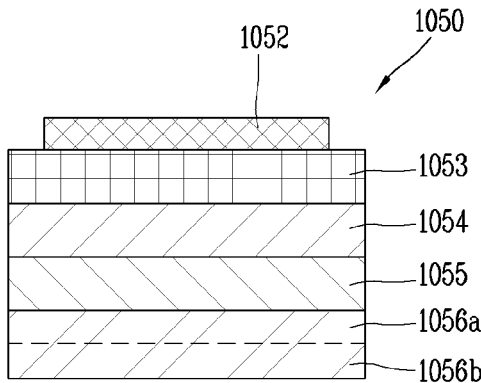
FIG. 9 is a conceptual diagram for describing the semiconductor light emitting diode of FIGS. 8A to 8E.

Next, the board 161 is transferred to an assembly position, and the semiconductor light emitting diodes 1050 are put into the fluid chamber 162 (FIG. 8A).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Figure 8B:
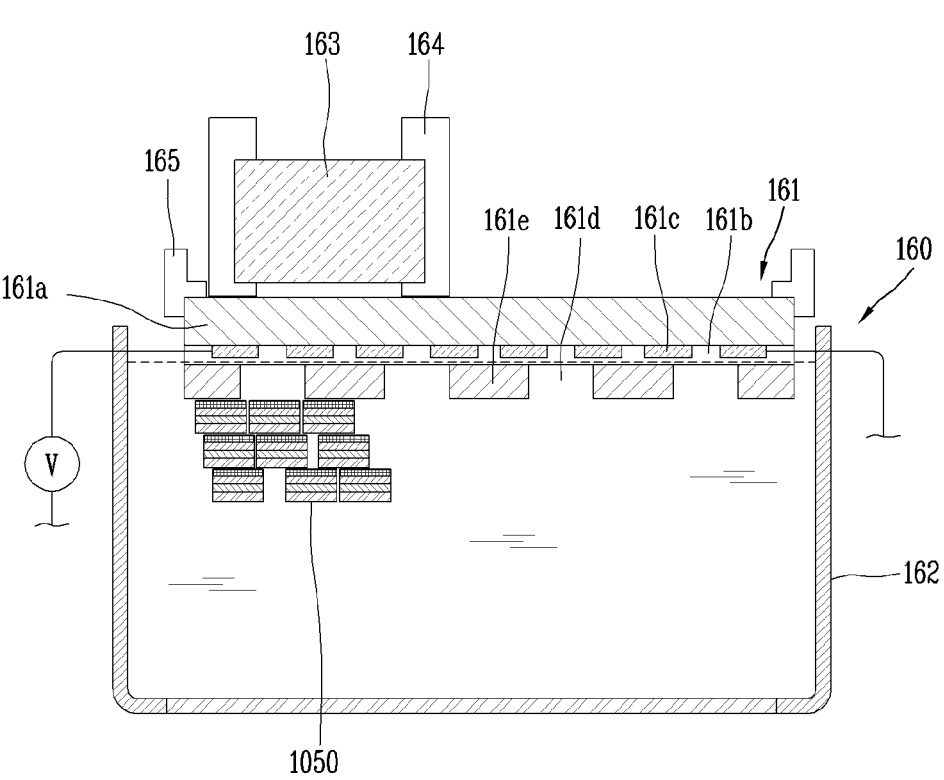

Next, a magnetic force is applied to the semiconductor light emitting diodes 1050 such that the semiconductor light emitting diodes 1050 vertically float in the fluid chamber 162 (FIG. 8B).

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Figure 8C:
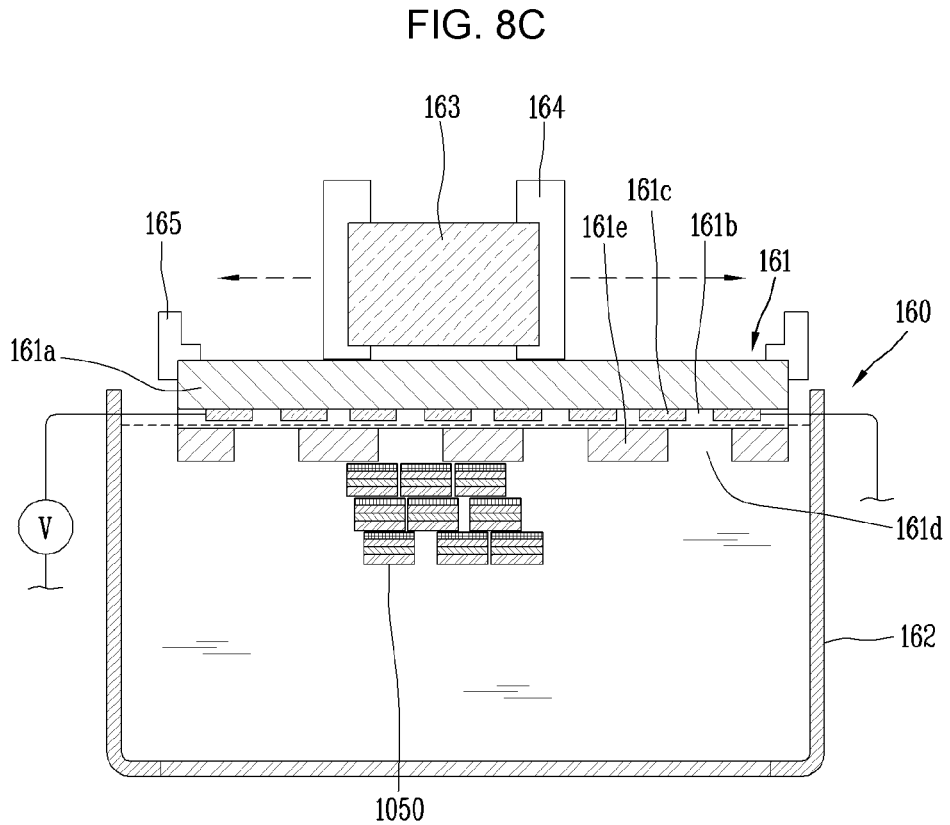
Figure 8D:
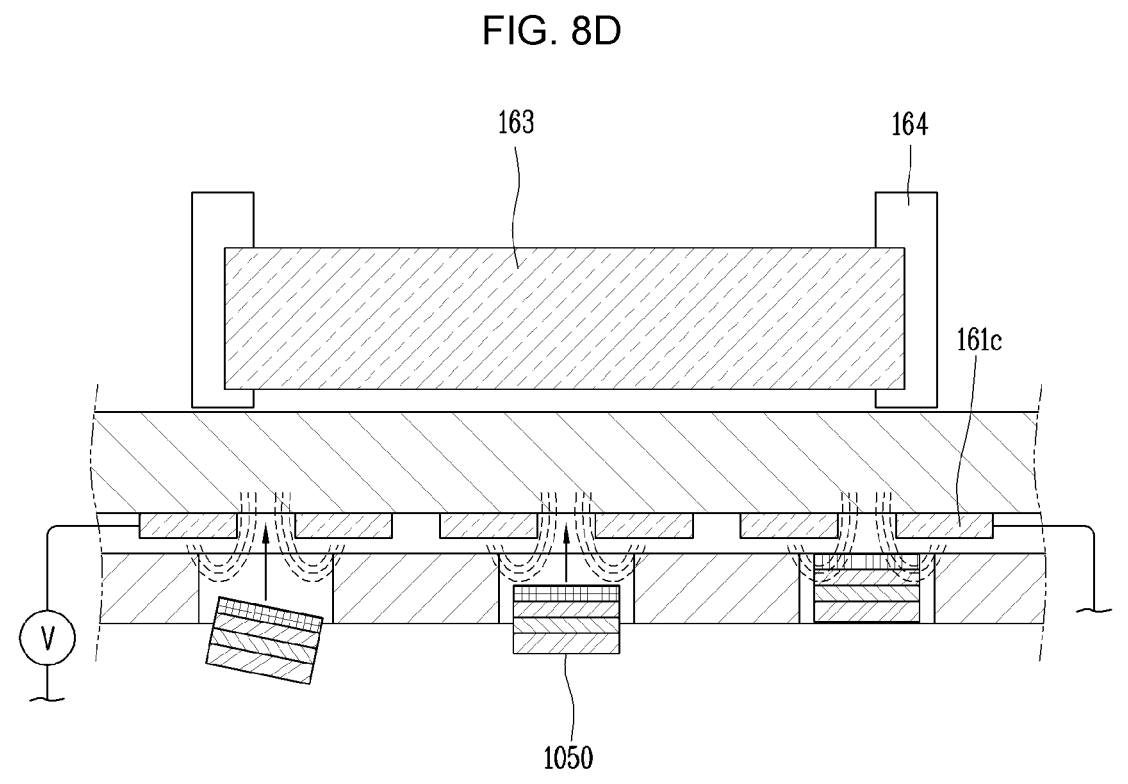
Figure 8E:
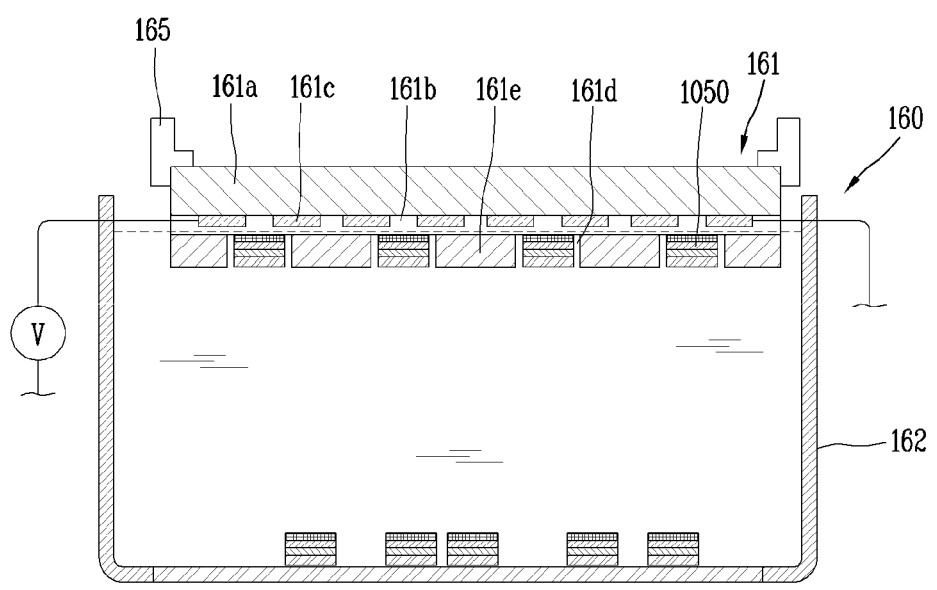

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8C). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8C). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8D). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-area display device at a low cost.

Meanwhile, there have been continuous attempts to reduce the size of the above-described red semiconductor light emitting diode in order to improve the image quality of the display device. In a case where the size of the semiconductor light emitting diode is reduced, the surface recombination phenomenon occurring at the side surface of the semiconductor light emitting diode and the amount of light escaping to the side surface of the semiconductor light emitting diode have a great influence on the light efficiency.

First, the surface recombination phenomenon occurring at the side surface of the semiconductor light emitting diode will be described in detail.

Figure 10:
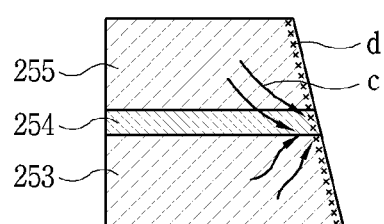
FIG. 10 is a conceptual diagram illustrating a factor of a decrease in light efficiency of a semiconductor light emitting diode.

FIG. 10 is a conceptual diagram illustrating a factor of a decrease in light efficiency of a semiconductor light emitting diode.

Referring to FIG. 10, a large amount of defect (d) are generated on the side surface of the semiconductor light emitting diode due to the mesa process and the isolation process for manufacturing the semiconductor light emitting diode. When a voltage is applied to the semiconductor light emitting diode, some carriers in the semiconductor light emitting diode (herein, a term including both electrons and holes is referred to as a carrier) move to the defect (d), and combine with the defect (d). Since the carrier (c) combined with the defect (d) cannot be utilized to emit light in the active layer, the light efficiency of the semiconductor light emitting diode is reduced. In particular, the decrease in light efficiency due to the aforementioned surface recombination increases as the size of the semiconductor light emitting diode becomes smaller.

Meanwhile, as the size of the semiconductor light emitting diode becomes smaller, the amount of light emitted and lost toward the side surface of the semiconductor light emitting diode has a great influence on the light efficiency of the semiconductor light emitting diode.

The present disclosure provides a structure for increasing the light efficiency of a semiconductor light emitting diode. Before describing the structure of the semiconductor light emitting diode according to the present disclosure, a method of manufacturing the semiconductor light emitting diode will be described.

Hereinafter, the step of forming the semiconductor light emitting diode will be described in more detail.

Figure 11:
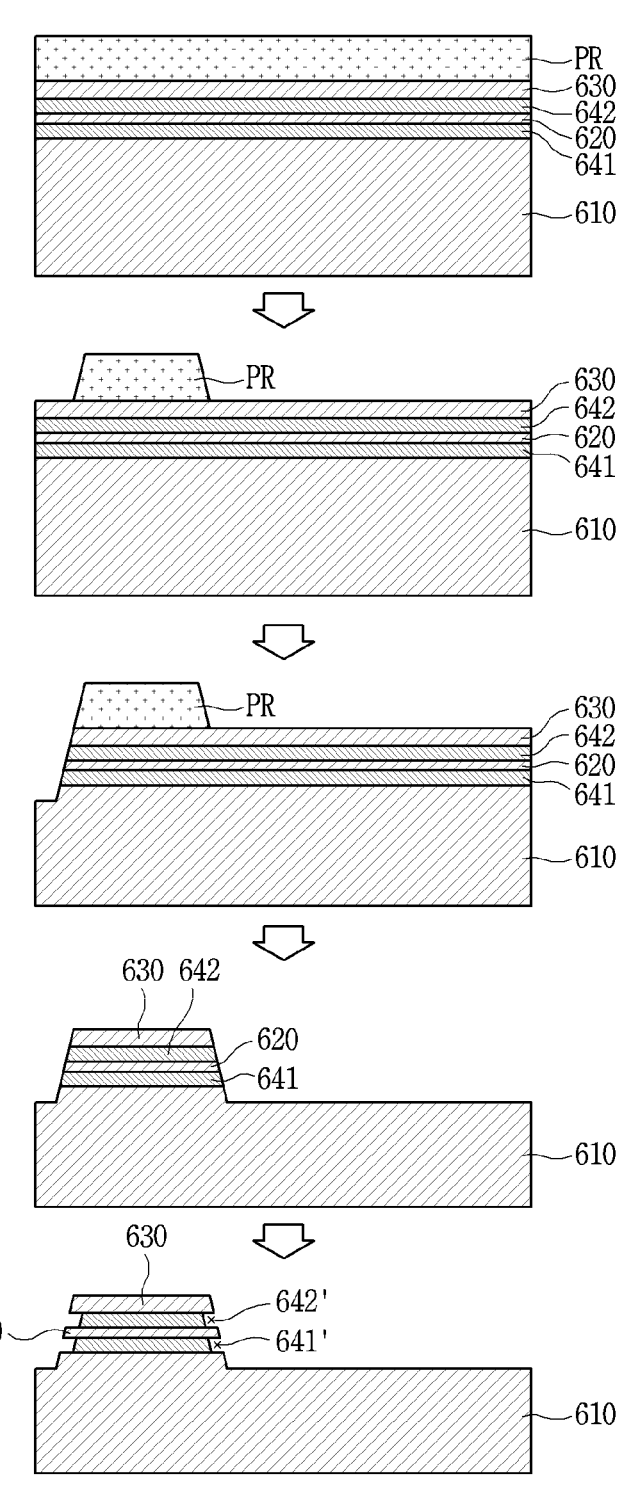
FIG. 11 is a conceptual diagram illustrating a method of manufacturing a semiconductor light emitting diode according to an embodiment of the present disclosure.

FIG. 11 is a conceptual diagram illustrating a method of manufacturing a semiconductor light emitting diode according to an embodiment of the present disclosure.

First, a step of forming an epi layer on a growth substrate is performed. Here, the growth substrate may be a sapphire substrate or a GaAs substrate. Meanwhile, the epi layer is a layer in which a first conductivity type semiconductor layer 610, a first barrier layer 641, an active layer 620, a second barrier layer 642, and a second conductivity type semiconductor layer 630 are sequentially stacked.

Thereafter, a portion of the first conductivity type semiconductor layer 610 is exposed to the outside through a mesa process. During the mesa process, portions of the first barrier layer 641, the active layer 620, the second barrier layer 642, and the second conductivity type semiconductor layer 630 are etched.

Specifically explain for the mesa process, after a photoresist layer PR on the epi layer is stacked, the photoresist layer PR is patterned. Thereafter, portions of the first barrier layer 641, the active layer 620, the second barrier layer 642, and the second conductivity type semiconductor layer 630 are etched through dry etching. Finally, the patterned photoresist layer PR is removed.

Thereafter, a step of etching the first and second barrier layers 641 and 642 is performed. Specifically, the step of etching the first and second barrier layers 641 and 642 may be performed by immersing the epi layer on which the mesa process is completed in an etching solution. In this case, the rate at which the first and second barrier layers 641 and 642 are etched by the etching solution and the rate at which the active layer 620 and the first and second conductivity type semiconductor layers 610 and 630 are etched by the etching solution are different from each other. Accordingly, a plurality of recessed portions 641' and 642' are formed on the mesa surface.

In an embodiment, the rate at which the first and second barrier layers 641 and 642 are etched by the etching solution may be faster than the rate at which the active layer 620 and the first and second conductivity type semiconductor layers 610 and 630 are etched by the etching solution. In this case, as the first and second barrier layers 641 and 642 are etched relatively quickly, the recessed portions 641' and 642' are formed between the first conductivity type semiconductor layer 610 and the active layer 620 and between the active layer 620 and the second conductivity type semiconductor layer 630.

For example, the first and second conductivity type semiconductor layers 610 and 630 may be P-type AlGaInP or N-type AlGaInP, and each of the first and second conductivity type semiconductor layers 610 and 630 may be in a state where different types of dopants may be doped. Meanwhile, the active layer 620 may also use AlGaInP as a base material.

Alternatively, the first and second barrier layers 641 and 642 may be P-type AlInP or N-type AlInP. A type of dopant doped in each of the first and second barrier layers 641 and 642 is identical to that of dopant doped in an adjacent conductivity type semiconductor layer. Specifically, the first barrier layer 641 is doped with the same type of dopant as the first conductivity type semiconductor layer 610, and the second barrier layer 642 is doped with the same type of dopant as the second conductivity type semiconductor layer 630.

In a case where the etching solution is a mixed solution of hydrofluoric acid and ammonium fluoride, AlGaInP is hardly etched, but AlInP is etched at a very high rate. As the first and second barrier layers 641 and 642 are etched relatively quickly, the recessed portions 641' and 642' are formed between the first conductivity type semiconductor layer 610 and the active layer 620 and between the active layer 620 and the second conductivity type semiconductor layer 610.

Thereafter, through an isolation process, a step of forming individual semiconductor light emitting diodes on the growth substrate S is performed. Since this process uses a known method, a detailed description thereof will be omitted. However, the process of forming the above-described recessed portion may be performed after the isolation process, not immediately after the mesa process.

Hereinafter, the structure of the semiconductor light emitting diode manufactured in the above-described manner will be described in detail.

Figure 12:
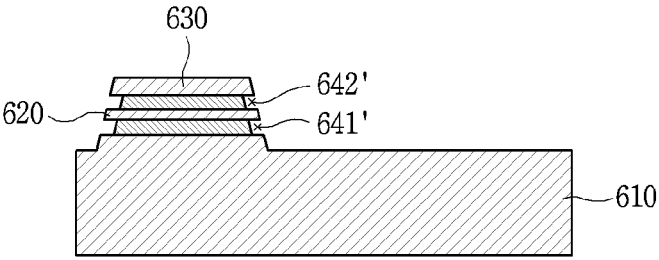
FIG. 12 is a cross-sectional view of a semiconductor light emitting diode according to an embodiment of the present disclosure.
Figure 13:
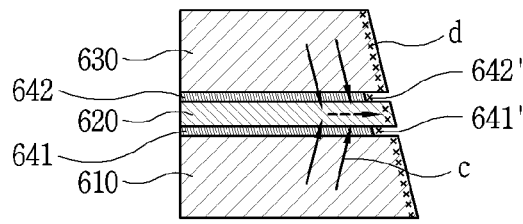
FIG. 13 is a conceptual diagram illustrating a flow of carriers in a semiconductor light emitting diode according to an embodiment of the present disclosure.

FIG. 12 is a cross-sectional view of a semiconductor light emitting diode according to an embodiment of the present disclosure, and FIG. 13 is a conceptual diagram illustrating a flow of carriers in a semiconductor light emitting diode according to an embodiment of the present disclosure.

Referring to FIG. 12, a plurality of recessed portions 641' and 642' are formed on the side surface of the semiconductor light emitting diode according to the present disclosure.

Each of the semiconductor light emitting diodes includes a first conductivity type semiconductor layer 610, an active layer 620 formed on the first conductivity type semiconductor layer 610, and a second conductivity type semiconductor layer 630 formed on the active layer 620, in which a first barrier layer 641 is disposed between the first conductivity type semiconductor layer 610 and the active layer 620, and a second barrier layer 642 is disposed between the active layer 620 and the second conductivity type semiconductor layer 630.

Recessed portions 641' and 642' are formed between the first conductivity type semiconductor layer 610 and the active layer 620, and between the active layer 620 and the second conductivity type semiconductor layer 630. Accordingly, the recessed portion is formed with the active layer 620 interposed therebetween.

The recessed portion may be divided into a first recessed portion 641' formed between the first conductivity type semiconductor layer 610 and the active layer 620, and a second recessed portion 642 formed between the active layer 620 and the second conductivity type semiconductor layer 630.

An inner wall of the first recessed portion 641' is formed of one surface of the first conductivity type semiconductor layer 610, one surface of the active layer 620, and a side surface of the first barrier layer 641, and the inner wall of the second recessed portion 642' is formed of one surface of the second conductivity type semiconductor layer 630, one surface of the active layer 620, and a side surface of the second barrier layer 642.

Referring to FIG. 13, the resistance around the active layer 620 in the lateral direction is very large. Accordingly, carriers flowing in the lateral direction of the semiconductor light emitting diode are reduced, and the carriers are concentrated in the direction in which the active layer 620 is located. As a result, surface recombination is reduced. Through this, the present disclosure improves the light efficiency of the semiconductor light emitting diode.

Meanwhile, the semiconductor light emitting diode according to the present disclosure may include a recessed portion formed at a location other than around the active layer 620. Hereinafter, the step of forming the semiconductor light emitting diode will be described in more detail.

Figure 14:
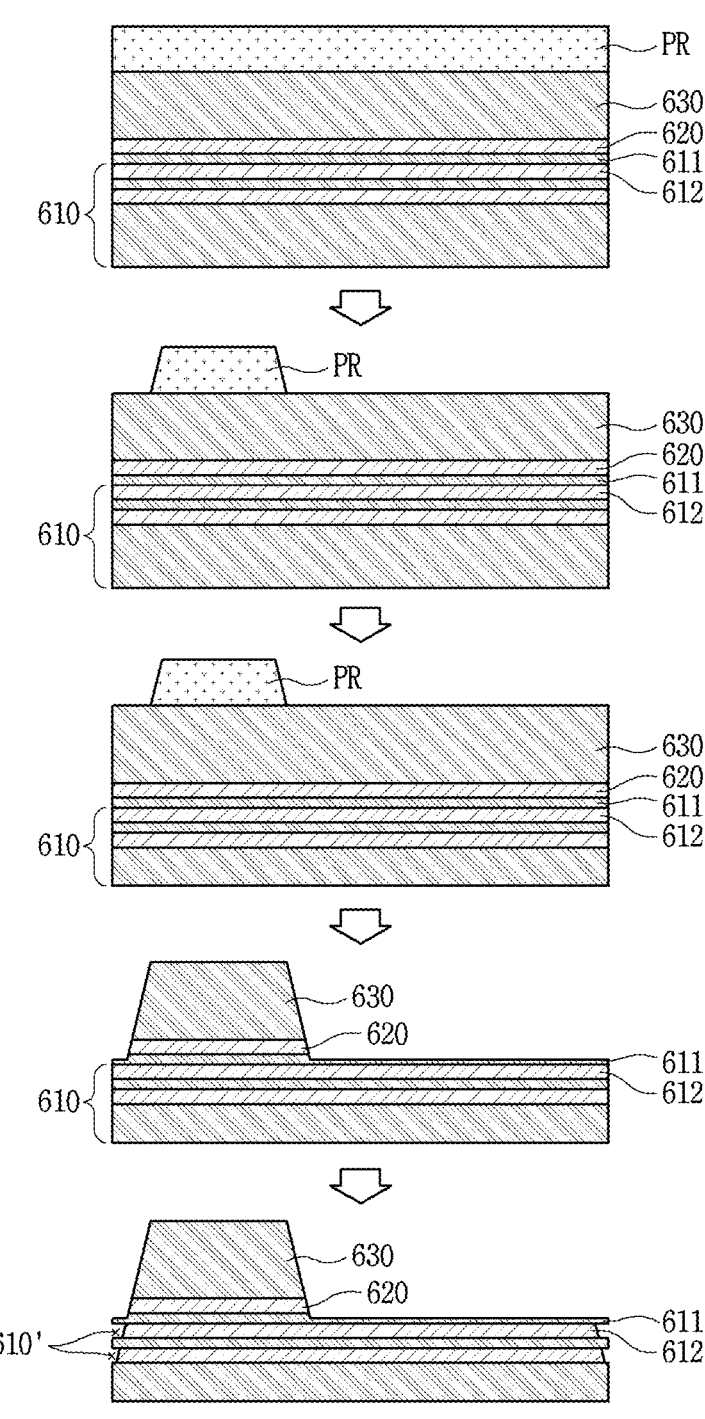
FIG. 14 is a conceptual diagram illustrating a method of manufacturing a semiconductor light emitting diode according to another embodiment of the present disclosure.

FIG. 14 is a conceptual diagram illustrating a method of manufacturing a semiconductor light emitting diode according to another embodiment of the present disclosure.

First, a step of forming an epi layer on a growth substrate is performed. Here, the growth substrate may be a sapphire substrate or a GaAs substrate. Meanwhile, the epi layer is a layer in which a first conductivity type semiconductor layer 610, an active layer 620, and a second conductivity type semiconductor layer 630 are sequentially stacked.

Here, the first conductivity type semiconductor layer 610 includes a plurality of first semiconductor layers 611 and a plurality of second semiconductor layers 612 made of a material different from that of the first semiconductor layer 611. The first semiconductor layer 611 and the second semiconductor layer 612 are alternately stacked.

Thereafter, a step of forming individual semiconductor light emitting diode on the growth substrate S is performed through an isolation process and a mesa process. Since this process uses a known method, a detailed description thereof will be omitted.

Thereafter, the step of etching the second semiconductor layer 612 is performed. Specifically, the step of etching the second semiconductor layer 612 may be performed by immersing the epi layer on which the mesa process and the isolation process are completed in an etching solution. At this time, the rate at which the second semiconductor layer 612 is etched by the etching solution and the rate at which the active layer 620, the first semiconductor layer 611, and the second conductivity type semiconductor layer 630 are etched by the etching solution are different from each other. Accordingly, a plurality of recessed portions 610' are formed on the side surface of the first conductivity type semiconductor layer 610.

In an embodiment, the rate at which the second semiconductor layer 612 is etched by the etching solution may be faster than the rate at which the active layer 620, the first semiconductor layer 611, and the second conductivity type semiconductor layer 630 are etched by the etching solution. In this case, as the second semiconductor layer 612 is etched relatively quickly, a recessed portion 610' is formed between the first semiconductor layers 611.

For example, the first semiconductor layer 611 and the second conductivity type semiconductor layer 630 may be P-type AlGaInP or N-type AlGaInP, and each of the first semiconductor layer 611 and the second conductivity type semiconductor layer 630 may be in a state of different types of dopants are doped. Meanwhile, the active layer 620 may also use AlGaInP as a base material.

Alternatively, the second semiconductor layer 612 may be P-type AlInP or N-type AlInP. The type of dopant doped in the second semiconductor layer 612 is identical to the type of dopant doped in the first semiconductor layer 611.

When the etching solution is a mixed solution of hydrofluoric acid and ammonium fluoride, AlGaInP is hardly etched, but AlInP is etched at a very high rate. As the second semiconductor layer 612 is etched relatively quickly, a recessed portion 610' is formed between the first semiconductor layers 611.

Hereinafter, the structure of the semiconductor light emitting diode manufactured in the above-described manner will be described in detail.

Figure 15:
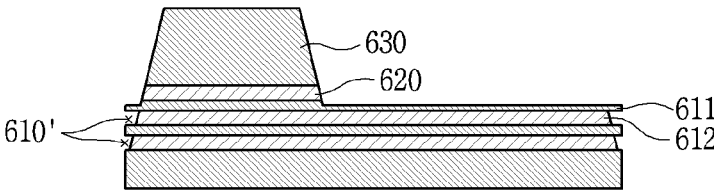
FIG. 15 is a cross-sectional view of a semiconductor light emitting diode according to another embodiment of the present disclosure.

FIG. 15 is a cross-sectional view of a semiconductor light emitting diode according to another embodiment of the present disclosure.

A plurality of recessed portions 610' are formed on the side surface of the semiconductor light emitting diode according to the present disclosure.

Each of the semiconductor light emitting diodes includes a first conductivity type semiconductor layer 610, an active layer 620 formed on the first conductivity type semiconductor layer 610, and a second conductivity type semiconductor layer 630 formed on the active layer 620, and the first conductivity type semiconductor layer 610 includes first and second semiconductor layers 611 and 612 alternately disposed with each other.

The first conductivity type semiconductor layer 610 includes a plurality of first semiconductor layers 611 and a plurality of second semiconductor layers 612, and the recessed portion 610' is formed between the first semiconductor layers 611. The number of the recessed portion 610' is the same as the number of the second semiconductor layers 612 provided in the first conductivity type semiconductor layer 610.

An inner wall of the recessed portion is formed of one surface of the first semiconductor layer 611 and a side surface of the second semiconductor layer 612.

According to the above structure, the recessed portion induces diffuse reflection from the side surface of the semiconductor light emitting diode to reflect light emitted from the active layer toward the side surface of the semiconductor light emitting diode toward the upper side of the semiconductor light emitting diode. Accordingly, while the amount of light emitted to the side surface of the semiconductor light emitting diode may decrease, the light efficiency of the semiconductor light emitting diode may increase.

Meanwhile, the semiconductor light emitting diode according to the present disclosure may include a recessed portion formed on the entire side surface. Hereinafter, a method of forming a semiconductor light emitting diode will be described in more detail.

Figure 16:
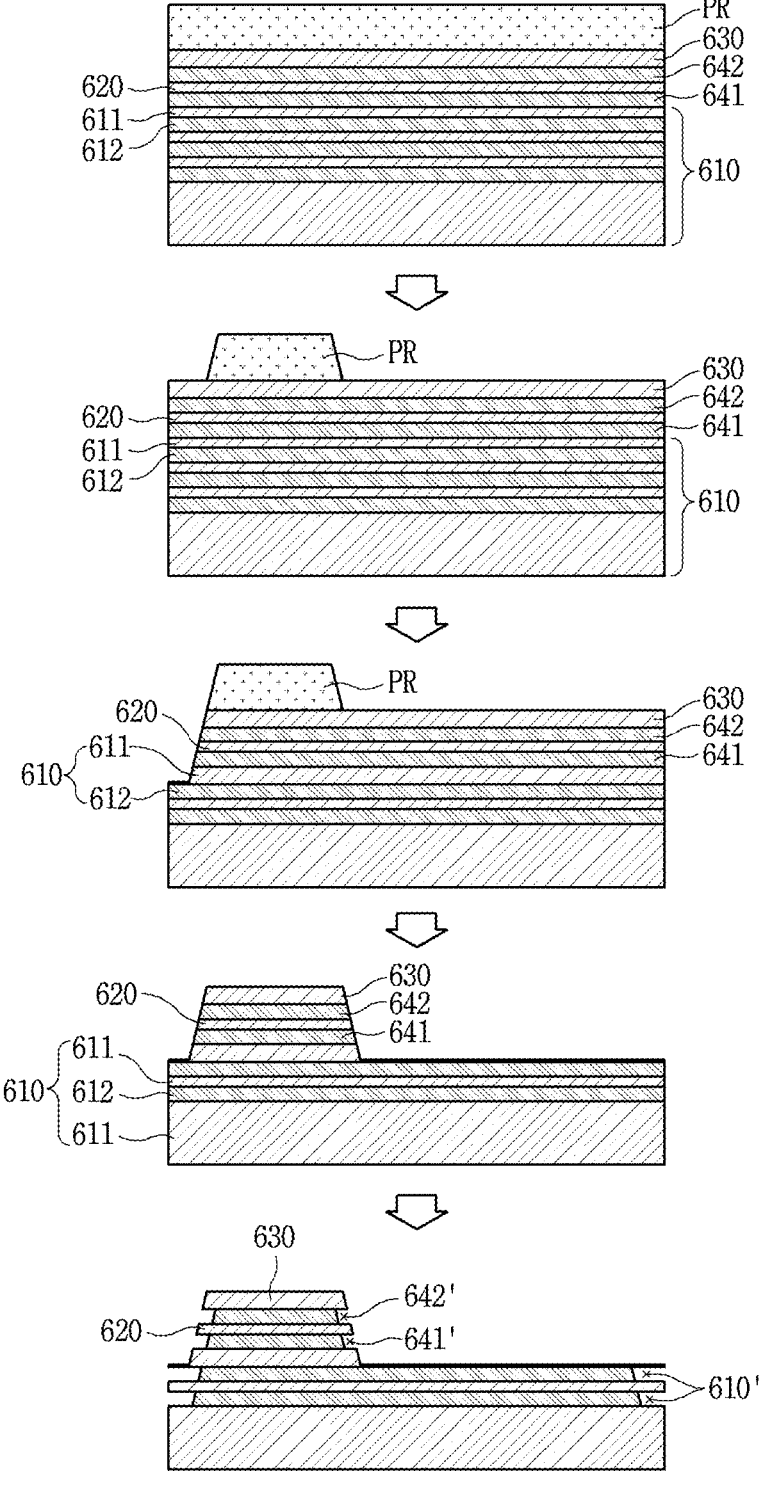
FIG. 16 is a conceptual diagram illustrating a method of manufacturing a semiconductor light emitting diode according to another embodiment of the present disclosure.

FIG. 16 is a conceptual diagram illustrating a method of manufacturing a semiconductor light emitting diode according to another embodiment of the present disclosure.

First, a step of forming an epi layer on a growth substrate is performed. Here, the growth substrate may be a sapphire substrate or a GaAs substrate. Meanwhile, the epi layer is a layer in which a first conductivity type semiconductor layer 610, a first barrier layer 641, an active layer 620, a second barrier layer 642, and a second conductivity type semiconductor layer 630 are sequentially stacked.

Here, the first conductivity type semiconductor layer 610 includes a plurality of first semiconductor layers 611 and a plurality of second semiconductor layers 612 made of a material different from that of the first semiconductor layer 611. The first semiconductor layer 611 and the second semiconductor layer 612 are alternately stacked.

Thereafter, a portion of the first conductivity type semiconductor layer 610 is exposed to the outside through a mesa process. During the mesa process, portions of the first barrier layer 641, the active layer 620, the second barrier layer 642, and the second conductivity type semiconductor layer 630 are etched.

Specifically explain for the mesa process, after a photoresist layer PR is stacked on the epi layer, the photoresist layer PR is patterned. Thereafter, portions of the first barrier layer 641, the active layer 620, the second barrier layer 642, and the second conductivity type semiconductor layer 630 are etched through dry etching. Finally, the patterned photoresist layer PR is removed.

Thereafter, through an isolation process, a step of forming individual semiconductor light emitting diodes on the growth substrate S is performed. Since this process uses a known method, a detailed description thereof will be omitted. As the isolation process is performed, the side surface of the first conductivity type semiconductor layer 610 is exposed to the outside.

Thereafter, the step of etching the second semiconductor layer 612 and the first and second barrier layers 641 and 642 is performed. Specifically, the step of etching the second semiconductor layer 612 and the first and second barrier layers 641 and 642 may be performed by immersing the epi layer on which the mesa process and the isolation process are completed in an etching solution. At this time, the rate at which the second semiconductor layer 612 and the first and second barrier layers 641 and 642 are etched by the etching solution and the rate at which the active layer 620 and the first semiconductor layer 611 are etched by the etching solution is different from each other. Accordingly, a plurality of recessed portions are formed on the mesa surface and the side surface of the first conductivity type semiconductor layer 610.

In an embodiment, the rate at which the second semiconductor layer 612 and the first and second barrier layers 641 and 642 are etched by the etching solution may be faster than the rate at which the active layer 620 and the first semiconductor layer 611, and the second conductivity type semiconductor layer 630 are etched by the etching solution. In this case, as the second semiconductor layer 612 and the first and second barrier layers 641 and 642 are etched relatively quickly, the recessed portions are formed between the first semiconductor layers 611, between the first conductivity type semiconductor layer 610 and the active layer 620, and between the active layer 620 and the second conductivity type semiconductor layer 630.

For example, the first semiconductor layer 611 and the second conductivity type semiconductor layer 630 may be P-type AlGaInP or N-type AlGaInP, and each of the first semiconductor layer 611 and the second conductivity type semiconductor layer 630 may be in a state where different types of dopants is doped. Meanwhile, the active layer 620 may also use AlGaInP as a base material.

Alternatively, the second semiconductor layer 612 and the first and second barrier layers 641 and 642 may be P-type AlInP or N-type AlInP.

The type of dopant doped in the second semiconductor layer 612 is identical to the type of dopant doped in the first semiconductor layer 611. A type of dopant doped in each of the first and second barrier layers 641 and 642 is identical to that of a dopant doped in an adjacent conductivity type semiconductor layer. Specifically, the first barrier layer 641 is doped with the same type of dopant as the first conductivity type semiconductor layer 610, and the second barrier layer 642 is doped with the same type of dopant as the second conductivity type semiconductor layer 630.

When the etching solution is a mixed solution of hydrofluoric acid and ammonium fluoride, AlGaInP is hardly etched, but AlInP is etched at a very high rate. As the second semiconductor layer 612 and the first and second barrier layers 641 and 642 are etched relatively quickly, a recessed portion is formed between the first semiconductor layers 611, between the first conductivity type semiconductor layer 610, and the active layer 620 and between the active layer 620 and the second conductivity type semiconductor layer 630.

Hereinafter, the structure of the semiconductor light emitting diode manufactured in the above-described manner will be described in detail.

Figure 17:
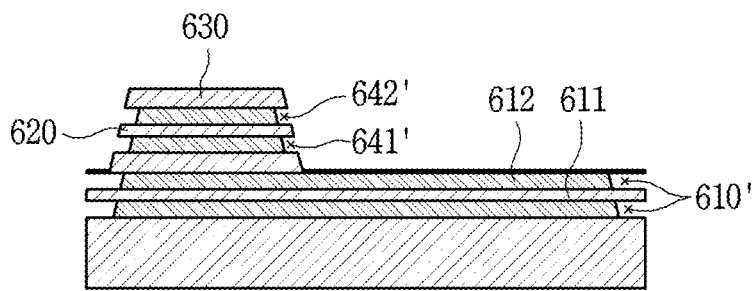
FIG. 17 is a cross-sectional view of a semiconductor light emitting diode according to another embodiment of the present disclosure.

FIG. 17 is a cross-sectional view of a semiconductor light emitting diode according to another embodiment of the present disclosure.

A plurality of recessed portions are formed on the side surface of the semiconductor light emitting diode according to the present disclosure.

Each of the semiconductor light emitting diodes includes a first conductivity type semiconductor layer 610, an active layer 620 formed on the first conductivity type semiconductor layer 610, and a second conductivity type semiconductor layer 630 formed on the active layer 620, in which a first barrier layer 641 is disposed between the first conductivity type semiconductor layer 610 and the active layer 620, and a second barrier layer 642 is disposed between the active layer 620 and the second conductivity type semiconductor layer 630. Meanwhile, the first conductivity type semiconductor layer 610 includes first and second semiconductor layers 611 and 612 that are alternately disposed.

The recessed portions are formed between the first conductivity type semiconductor layer 610 and the active layer 620 and between the active layer 620 and the second conductivity type semiconductor layer 630. Accordingly, the recessed portions are formed with the active layer 620 interposed therebetween.

The recessed portion may be divided into a first recessed portion 641' formed between the first conductivity type semiconductor layer 610 and the active layer 620, a second recessed portion 642' formed between the active layer 620 and the second conductivity type semiconductor layer 630, and a third recessed portion 610' formed between the first semiconductor layers 611.

An inner wall of the first recessed portion 641' is formed of one surface of the first conductivity type semiconductor layer 610, one surface of the active layer 620, and a side surface of the first barrier layer 641, and an inner wall of the second recessed portion 642' is formed of one surface of the second conductivity type semiconductor layer 630, one surface of the active layer 620, and a side surface of the second barrier layer 642.

The third recessed portion 610' is formed between the first semiconductor layers 611. The number of the third recessed portions 610' is the same as the number of the second semiconductor layers 612 provided in the first conductivity type semiconductor layer 610. An inner wall of the third recessed portion 610' is formed of one surface of the first semiconductor layer 611 and a side surface of the second semiconductor layer 612.

According to the above-described structure, the resistance around the active layer 620 in the lateral direction is very large. Accordingly, carriers flowing in the lateral direction of the semiconductor light emitting diode are reduced, and the carriers are concentrated in the direction in which the active layer 620 is located. As a result, a phenomenon in which carriers are combined from the side surface of the active layer 620 (Surface recombination) is reduced. Through this, the present disclosure improves the light efficiency of the red semiconductor light emitting diode.

In addition, according to the above structure, the recessed portion induces diffuse reflection from the side surface of the semiconductor light emitting diode to reflect light emitted from the active layer toward the side surface of the semiconductor light emitting diode toward the upper side of the semiconductor light emitting diode. Accordingly, while the amount of light emitted to the side surface of the semiconductor light emitting diode may decrease, the light efficiency of the semiconductor light emitting diode may increase.

The invention claimed is:

1. A display device comprising:
   a board including a wiring electrode; and
   a plurality of semiconductor light emitting diodes electrically connected to the wiring electrode;
   wherein each of the plurality of semiconductor light emitting diodes includes:
      a first conductivity type semiconductor layer;
      an active layer on the first conductivity type semiconductor layer; and
      a second conductivity type semiconductor layer on the active layer,
   wherein the first conductivity type semiconductor layer includes a plurality of recessed portions, wherein the first conductivity type semiconductor layer includes a plurality of first semiconductor layers and a plurality of second semiconductor layers that are alternately stacked, and
wherein the plurality of recessed portions are between the plurality of first semiconductor layers.

2. The display device of claim 1, wherein the plurality of recessed portions are formed in the plurality of second semiconductor layers, and
   wherein a number of the plurality of recessed portions formed in each semiconductor light emitting diode is a same as a number of the plurality of second semiconductor layers or an integer multiple of the number of the plurality of second semiconductor layers.

3. The display device of claim 2, wherein, for a recessed portion among the plurality of recessed portions, inner walls of the recessed portion is formed of one surface of one first semiconductor layer and a side surface of one second semiconductor layer from among the plurality of first semiconductor layers and the plurality of second semiconductor layers.

4. The display device of claim 3, wherein an etching rate for a predetermined solution of a material constituting the second semiconductor layer is faster than an etching rate for the predetermined solution of a material constituting the active layer, the first semiconductor layer, and the second conductivity type semiconductor layer.

5. The display device of claim 4, wherein the second semiconductor layer is formed of AlInP,
   wherein the active layer, the first semiconductor layer, and the second conductivity type semiconductor layer are formed of AlGaInP, and
   wherein the first semiconductor layer and the second semiconductor layer are doped with a first dopant, and the second conductive type semiconductor layer is doped with a second dopant.

6. The display device of claim 3, wherein each of the plurality of semiconductor light emitting diodes includes:
   a first barrier layer between the first conductivity type semiconductor layer and the active layer; and
   a second barrier layer between the active layer and the second conductivity type semiconductor layer.

7. The display device of claim 6, wherein each of the plurality of semiconductor light emitting diodes includes:
   a first recessed portion between the first conductivity type semiconductor layer and the active layer, and
   a second recessed portion between the active layer and the second conductivity type semiconductor layer.

8. The display device of claim 7, wherein the first recessed portion is in the first barrier layer, and the second recessed portion is in the second barrier layer.

9. The display device of claim 8, wherein a lateral length of the active layer is longer than a lateral length of the first barrier layer and a lateral length of the second barrier layer.

10. The display device of claim 1, wherein the first conductivity type semiconductor layer includes a first semiconductor layer of the plurality of first semiconductor layers and a second semiconductor layer of the plurality of second semiconductor layers, and
   wherein among Al, Ga, In and P, the second semiconductor layer includes Al, In and P but not Ga, and the first semiconductor layer includes Al, Ga, In and P.

11. A display device comprising:
   a board including a wiring electrode; and
   a plurality of semiconductor light emitting diodes electrically connected to the wiring electrode, wherein each of the plurality of semiconductor light emitting diodes includes:

a first conductivity type semiconductor layer;

a barrier layer on the first conductivity type semiconductor layer;

an active layer on the barrier layer; and a second conductivity type semiconductor layer on the active layer, wherein at least one of the barrier layer and the first conductivity type semiconductor layer includes a plurality of recessed portions in a plane direction of the at least one of the barrier layer and the first conductivity type semiconductor layer, wherein the first conductivity type semiconductor layer includes a plurality of first semiconductor layers and a plurality of second semiconductor layers that are alternately stacked, and wherein the plurality of recessed portions are between the plurality of first semiconductor layers.

12. The display device of claim 11, wherein among Al, Ga, In and P, each of the first conductivity type semiconductor layer, the barrier layer, the active layer, and second conductivity type semiconductor layer includes at least Al, In and P, and only the least one of the barrier layer and the first conductivity type semiconductor layer includes Ga.

13. The display device of claim 12, wherein only the second semiconductor layers include recessed portions from among the first semiconductor layers and the second semiconductor layers.

14. The display device of claim 11, wherein the barrier layer also includes a recessed portion.

* * * * *